United States Patent
Shi et al.

(10) Patent No.: US 9,372,492 B2
(45) Date of Patent: Jun. 21, 2016

(54) PROGRAMMABLE FREQUENCY RANGE FOR BOOST CONVERTER CLOCKS

(71) Applicant: QUALCOMM Incorporated, San Diego, CA (US)

(72) Inventors: Song S Shi, San Diego, CA (US); Pengfei Li, San Diego, CA (US); Lennart Karl-Axel Mathe, San Diego, CA (US); Yunfei Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 556 days.

(21) Appl. No.: 13/740,062

(22) Filed: Jan. 11, 2013

(65) Prior Publication Data

US 2014/0197814 A1    Jul. 17, 2014

(51) Int. Cl.

| | |
|---|---|
| *H02M 3/156* | (2006.01) |
| *G05F 3/02* | (2006.01) |
| *H03F 1/02* | (2006.01) |
| *H02M 3/155* | (2006.01) |
| *H02M 3/158* | (2006.01) |

(52) U.S. Cl.
CPC .............. *G05F 3/02* (2013.01); *H02M 3/155* (2013.01); *H03F 1/0238* (2013.01); *H02M 3/1582* (2013.01)

(58) Field of Classification Search
CPC .................. H02M 3/155–3/1584; H02M 1/10
USPC ..................... 323/282–290; 363/65
See application file for complete search history.

(56) References Cited

U.S. PATENT DOCUMENTS

| | | | |
|---|---|---|---|
| 6,348,781 B1 | 2/2002 | Midya et al. | |
| 7,432,689 B2 | 10/2008 | Miller et al. | |
| 7,802,113 B2 * | 9/2010 | Westwick et al. | 713/300 |
| 8,085,005 B2 | 12/2011 | Dearn | |
| 8,258,875 B1 | 9/2012 | Smith et al. | |
| 8,305,061 B1 * | 11/2012 | Zhang et al. | 323/283 |
| 8,773,084 B2 * | 7/2014 | Casey et al. | 323/259 |
| 2007/0024360 A1 | 2/2007 | Markowski | |
| 2007/0085519 A1 * | 4/2007 | Xu | 323/282 |
| 2008/0224674 A1 | 9/2008 | Hasegawa | |
| 2009/0086511 A1 | 4/2009 | Lin | |
| 2009/0243577 A1 * | 10/2009 | Lim | 323/283 |
| 2010/0231189 A1 * | 9/2010 | Chen et al. | 323/284 |
| 2011/0234195 A1 | 9/2011 | Suzuki et al. | |
| 2012/0032658 A1 | 2/2012 | Casey et al. | |
| 2012/0133299 A1 * | 5/2012 | Capodivacca | H05B 33/0857 315/297 |
| 2014/0111170 A1 * | 4/2014 | Shi et al. | 323/271 |

OTHER PUBLICATIONS

International Search Report and Written Opinion—PCT/US2014/011164—ISA/EPO—Jun. 25, 2014.

* cited by examiner

*Primary Examiner* — Jessica Han
(74) *Attorney, Agent, or Firm* — Chui-kiu Teresa Wong; Paul Holdaway (57) ABSTRACT

Techniques for generating a boost clock signal for a boost converter from a buck converter clock signal, wherein the boost clock signal has a limited frequency range. In an aspect, the boost clock signal has a maximum frequency determined by Vbst/T, wherein Vbst represents the difference between a target output voltage and a battery voltage, and T represents a predetermined cycle duration. The boost converter may include a pulse insertion block to limit the minimum frequency of the boost clock signal, and a dynamic blanking/delay block to limit the maximum frequency of the boost clock signal. Further techniques are disclosed for generally implementing the minimum frequency limiting and maximum frequency limiting blocks.

20 Claims, 11 Drawing Sheets

PROGRAMMABLE FREQUENCY RANGE FOR BOOST CONVERTER CLOCKS

BACKGROUND

1. Field

The disclosure relates to techniques for programming the frequency of a clock signal for a boost converter.

2. Background

Boost converters are commonly used in electrical devices to boost a voltage from one level (e.g., from a battery source) to a higher level. Conversely, buck converters are used to step down a voltage from one level to a lower level. In certain types of applications, e.g., in an envelope tracking (ET) system for efficiently supplying a radio-frequency (RF) power amplifier (PA), boost and buck converters may be jointly provided to furnish the power supply to the PA. In particular, the boost converter may provide a boosted voltage when necessary to enable the positive rail of the PA to rise above the battery voltage, while the buck converter may provide a low-frequency component of the PA supply voltage less than the battery voltage.

Both boost and buck converters commonly incorporate a plurality of switches that are driven by boost and buck clock signals, respectively. For example, the boost clock signal may control the switches of the boost converter to set the output voltage to a target boost voltage. Similarly, the buck clock signal may control the switches of the buck converter to set the output voltage to a target buck (stepped-down) voltage. In general, the buck and boost clock signals have requirements that are independent of each other. For example, the frequency of the boost clock signal should be limited to a predetermined frequency range that is partly a function of the target boost voltage, which is generally independent of the target buck voltage. Nevertheless, it would be desirable to synchronize the boost clock to the buck clock, to avoid the need to generate multiple independent clocks in a single system.

It would thus be desirable to provide techniques for generating a boost clock signal synchronous with a buck clock signal, which also ensure that the boost clock frequency is within a predetermined frequency range optimized for a particular target boost voltage.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Note in this specification and in the claims, the denotation of a signal or voltage as being "high" or "low" may refer to such signal or voltage being in a logical "high" or "low" state, which may (but need not) correspond to a "TRUE" (e.g., =1) or "FALSE" (e.g., =0) state for the signal or voltage. It will be appreciated that one of ordinary skill in the art may readily modify the logical conventions described herein, e.g., substitute "high" for "low" and/or "low" for "high," to derive circuitry having functionality substantially equivalent to that described herein. Such alternative exemplary embodiments are contemplated to be within the scope of the present disclosure.

Figure 1:
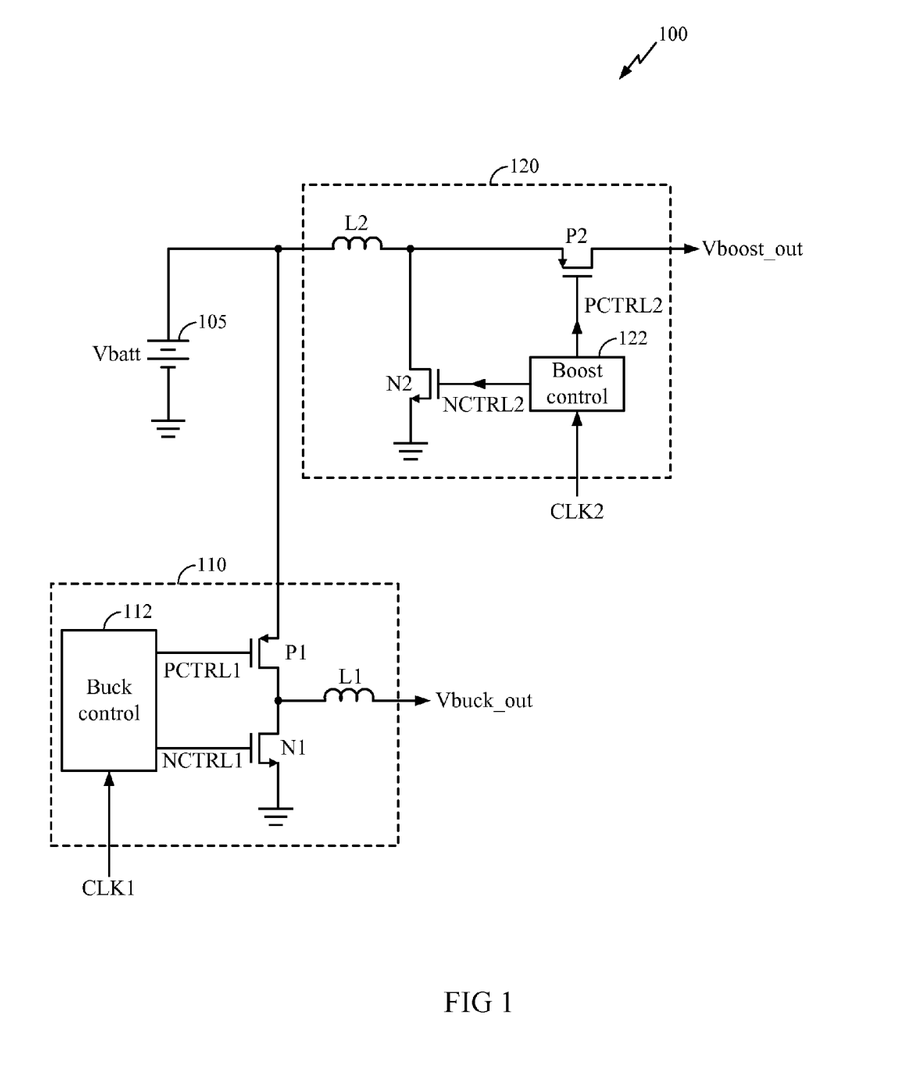
FIG. 1 illustrates an implementation of a system incorporating a buck converter and a boost converter according to the present disclosure.

FIG. 1 illustrates an implementation of a system 100 incorporating a buck converter and a boost converter according to the present disclosure. Note FIG. 1 is shown for illustrative purposes only, and is not meant to limit the scope of the present disclosure to only the system shown. For example, buck and boost converters may be implemented alternatively from what is shown in FIG. 1, e.g., one or more of the transistor switches may be replaced with other types of switches or equivalent elements known in the art. Such alternative exemplary embodiments are contemplated to be within the scope of the present disclosure.

FIG. 1 shows a buck converter 110 generating a buck output voltage Vbuck_out. The buck converter 110 is configured to step down a voltage Vbatt to a level Vbuck_out lower than Vbatt. In an implementation, Vbatt may be derived from a battery 105 of the system 100. The buck converter 110 is shown as including a buck inductor L1 coupled to transistor switches N1, P1. N1, P1 are controlled by switching or control voltages NCTRL1, PCTRL1, respectively, generated by a buck control block 112. Buck control block 112 receives a buck clock signal CLK1 from which the control voltages NCTRL1, PCTRL1 are derived.

Further shown in FIG. 1 is a boost converter 120 generating a voltage Vboost_out at a "boosted" level, i.e., higher than a supply voltage Vbatt of the boost converter 120. In FIG. 1, the boost converter 120 is shown as including a boost inductor L2 coupled to transistor switches N2, P2, which are controlled by switching or control voltages NCTRL2, PCTRL2, respectively, generated by a boost control block 122. Boost control block 122 receives a boost clock signal CLK2 from which the control voltages NCTRL2, PCTRL2 are derived. It will be appreciated that the level of Vboost_out generated by the boost controller 120 may generally depend on the frequencies and pulse durations of NCTRL2, PCTRL2.

In an implementation, the boost control block 122 may generate NCTRL2, PCTRL2 to have the same frequency as CLK2, while varying the duty cycles and/or pulse widths of NCTRL2 and PCTRL2. In particular, the boost control block 122 may control the duty cycles and/or pulse widths of NCTRL2 and PCTRL2 according to a feedback mechanism (not shown in FIG. 1), e.g., wherein the difference between Vboost_out and a desired target output voltage is used to adjust NCTRL2 and PCTRL2. In an implementation, NCTRL2 and PCTRL2 may be logical inverses of each other, i.e., N2 may be on while P2 is off, and N2 may be off while P2 is on. Note however that the techniques of the present disclosure may readily be applied to other types of control schemes wherein, e.g., in certain states, NCTRL2 and PCTRL2 may be configured to turn both N2 and P2 off simultaneously. Such alternative applications of the techniques disclosed herein are contemplated to be within the scope of the present disclosure.

It will be appreciated that, in general, the requirements of the buck clock signal CLK1 and the boost clock signal CLK2 will be different. For example, the output voltage Vboost_out of the boost converter 120 depends on the switching frequency of CLK2, while the output voltage Vbuck_out of the buck converter 110 depends on the switching frequency of CLK1, yet Vbuck_out and Vboost_out will generally be different from each other. Nevertheless, it would be desirable to share the clock signals for the buck converter 110 and the boost converter 120, or to otherwise synchronize CLK2 with CLK1, to avoid the need to generate multiple independent clock signals in the system 100.

Furthermore, for proper operation of the boost converter 120, it would be desirable to set the switching frequencies of NCTRL2, PCTRL2 to be within an optimal frequency range, e.g., between a minimum frequency Fmin and a maximum frequency Fmax. In particular, assuming a minimum (non-zero) on-time for the switches of the boost converter 120, configuring the switching frequency to be lower than Fmin would undesirably result in under-boost. On the other hand, configuring the switching frequency to be higher than Fmax would undesirably result in over-boost or current runaway issues at startup, wherein, e.g., the inductor is charged so frequently that the inductor current increases and eventually exceeds a predetermined current limit.

It is further noted that Fmax for the boost converter 120 may depend on a plurality of factors, including, e.g., the desired voltage boost, defined by the "boost voltage" Vbst= (Vboost_out−Vbatt), which represents the voltage difference (if any) between the output voltage Vboost_out of the boost converter 120 and the battery voltage Vbatt. For example, when Vbst is relatively large, Fmax should generally be set at a higher value, as a faster clock may be required for better current delivery capability. On the other hand, when Vbst is relatively small, a smaller duty cycle may be required, and therefore Fmax should be correspondingly set at a lower value to support a smaller duty cycle.

Techniques of the present disclosure provide for generating a boost clock for a boost converter that is synchronized with the buck clock signal, wherein the boost clock is further provided with a frequency in a range suitable for the operation of the boost converter.

Figure 2:
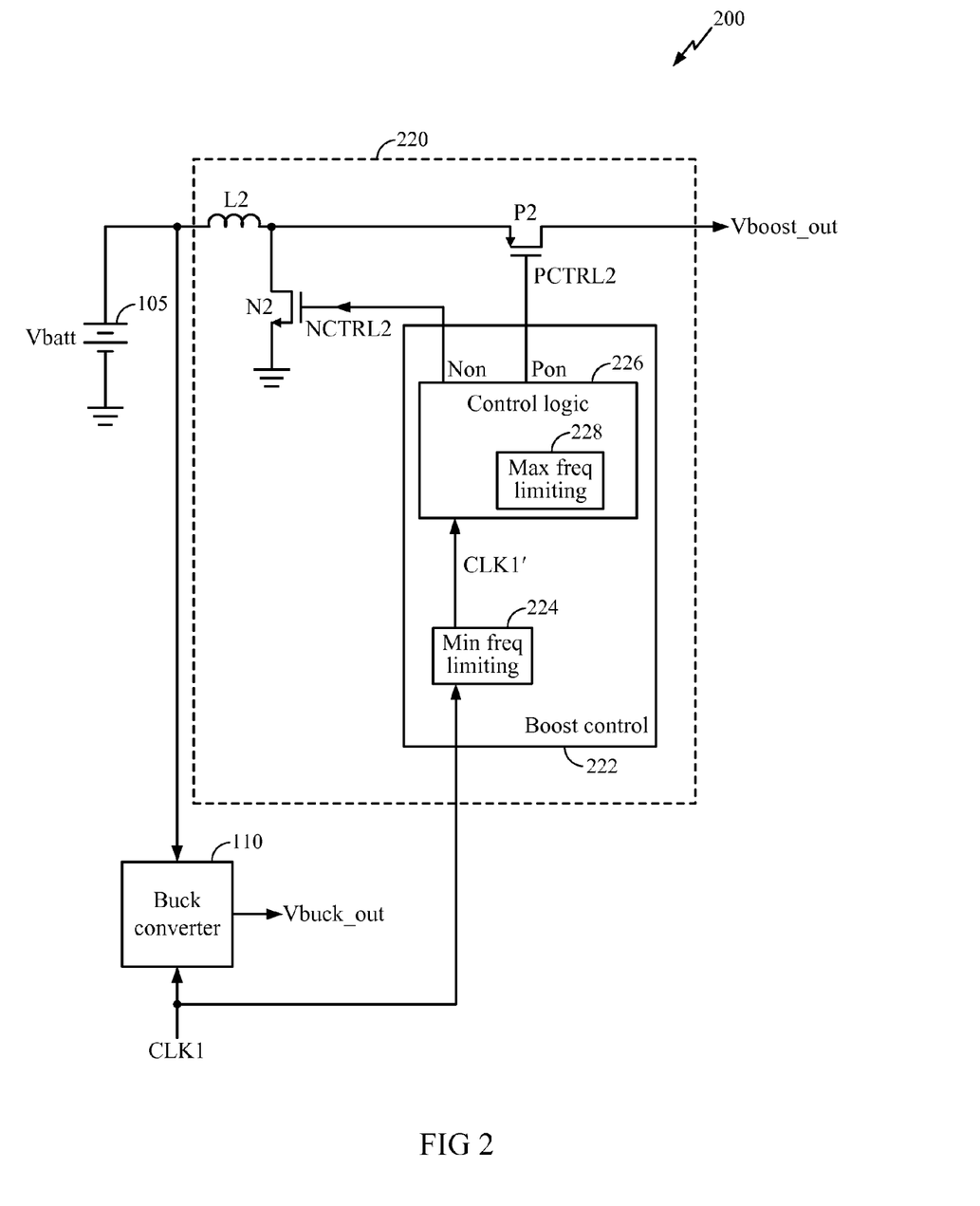
FIG. 2 illustrates an exemplary embodiment of the present disclosure, wherein a boost converter includes elements for generating the required output signals directly from the buck clock CLK1, without the need to access an independently generated boost clock.

FIG. 2 illustrates an exemplary embodiment 200 of the present disclosure, wherein a boost converter 220 includes elements for generating the required control signals for the boost converter directly from the buck clock CLK1, without the need to access an independently generated boost clock. Note the internal operation details of the buck converter 110 shown in FIG. 1 have been omitted from FIG. 2 for ease of illustration. Further note that similarly labeled elements in FIGS. 1 and 2 may correspond to elements having similar functionality, unless otherwise noted.

In FIG. 2, the boost converter 220 includes a boost control block 222 which receives the buck clock signal CLK1. Boost control block 222 includes a minimum frequency limiting block 224, which processes CLK1 to generate a modified clock signal CLK1' having a limited minimum frequency Fmin. CLK1' is coupled to a control logic block 226 of the boost control block 222. Block 226 includes control logic for deriving the output voltages Non and Pon for controlling N2 and P2, respectively. In an exemplary embodiment, Non may signal when N2 should be turned on (e.g., N2 should be conducting when Non is high), and may be directly coupled to NCTRL2. Likewise, Pon may signal when P2 should be turned on (e.g., P2 should be conducting when Pon is high), and may be directly coupled to PCTRL2. In an exemplary embodiment, Non and Pon may be logical inverses of each other, although it will be appreciated that the techniques disclosed herein need not be limited to exemplary embodiments wherein Pon is directly determined by Non in this manner.

Figure 3:
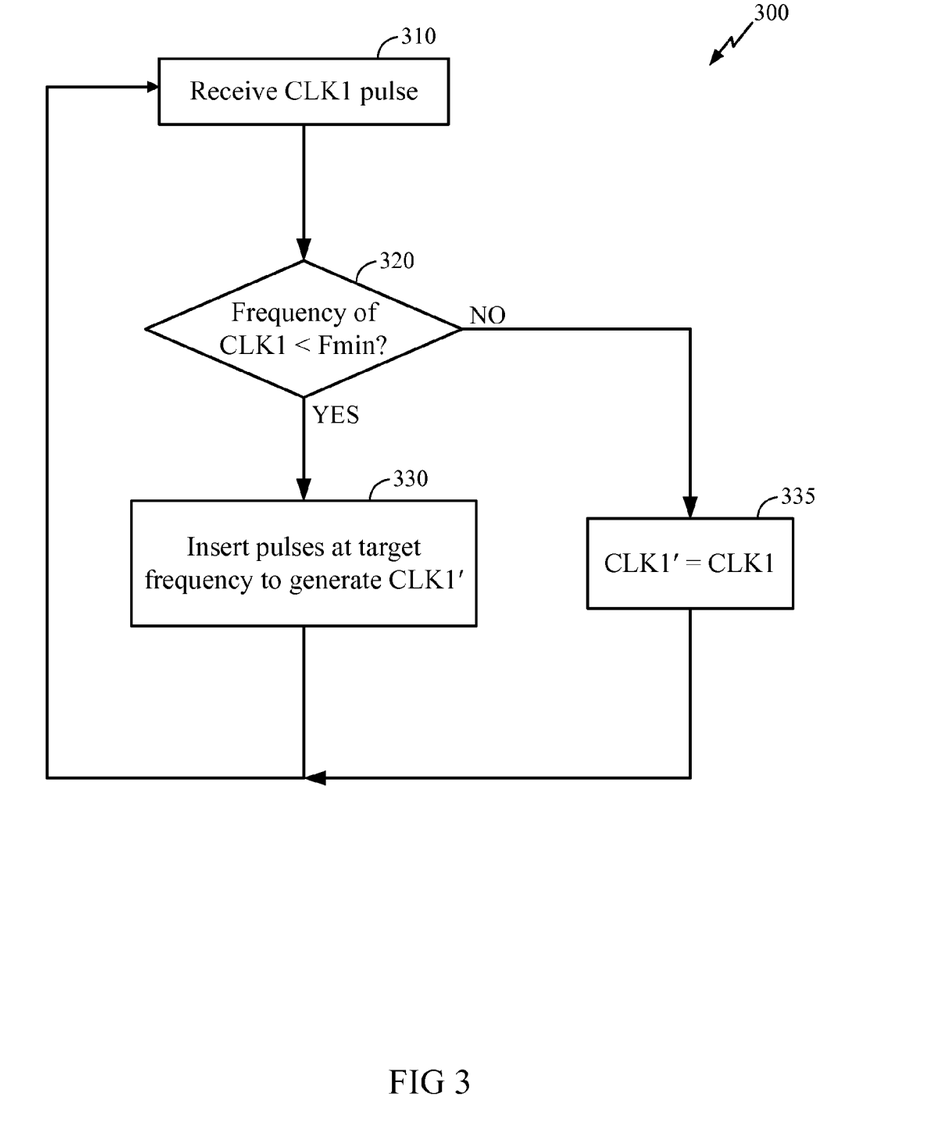
FIG. 3 illustrates an exemplary embodiment of a method that may be implemented by the minimum frequency limiting block, wherein pulse insertion is employed as the technique for minimum frequency limiting.

FIG. 3 illustrates an exemplary embodiment of a method 300 that may be implemented by the minimum frequency limiting block 224, wherein pulse insertion is employed as the technique for minimum frequency limiting. Note the method 300 is shown for illustrative purposes only, and is not meant to limit the scope of the present disclosure to any particular techniques for minimum frequency limiting. Alternative exemplary embodiments may employ other techniques for minimum frequency limiting known in the art, e.g., frequency multiplication techniques known in the art may be applied to increase the frequency of CLK1 if its initial frequency is determined to be less than the minimum threshold Fmin. Such alternative exemplary embodiments are contemplated to be within the scope of the present disclosure.

In FIG. 3, at block 310, the clock signal CLK1 is received.

At block 320, it is evaluated whether the frequency of CLK1 is less than a minimum predetermined frequency Fmin. If yes, the method proceeds to block 330. Otherwise, the method proceeds to block 335. For example, in an exemplary embodiment, the operation at block 320 is performed by detecting whether at least one pulse is present in CLK1 over a time interval 1/Fmin, or equivalently, whether at least N pulses are present in CLK1 over a time interval N/Fmin. If not, then CLK1 is determined to be less than Fmin.

At block 330, a pulse is inserted into CLK1 to generate CLK1'. In an exemplary embodiment, the pulse is periodically inserted at a target frequency corresponding to Fmin, such that the frequency of CLK1' is no less than Fmin. In an exemplary embodiment, the pulse width of the inserted pulse may be predetermined, e.g., the pulse width may be 400 nanoseconds (ns) for an Fmin of 1 MHz. It will be appreciated that whether to insert a high pulse (e.g., a "1" pulse) or a low pulse (e.g., a "0" pulse) in CLK1 at block 330 may be decided by the characteristics of CLK1, e.g., whether the majority of the cycle of CLK1 is low (in which case a high pulse may be inserted) or high (in which case a low pulse may be inserted).

Alternatively, at block 335, if the frequency of CLK1 is already greater than Fmin, then no processing needs to be applied to CLK1, and CLK1' may be directly set as CLK1.

Following completion of either block 330 or 335, the method returns to block 310 to receive the next CLK1 pulse.

Figure 4:
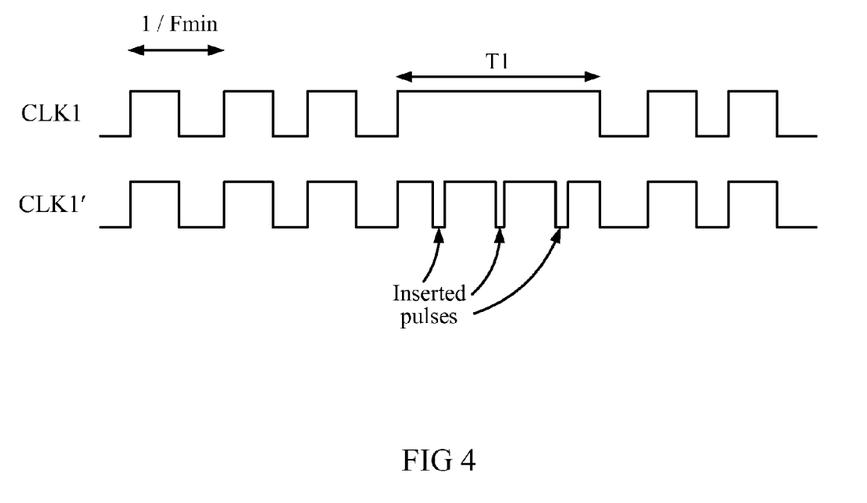
FIG. 4 illustrates exemplary signaling waveforms for CLK1 and CLK1' according to the clock insertion method described in FIG. 3.

FIG. 4 illustrates exemplary signaling waveforms for CLK1 and CLK1' according to the clock insertion method 300 described in FIG. 3. Note FIG. 4 is shown for illustrative purposes only, and is not meant to restrict the scope of the present disclosure to any particular signaling waveforms shown.

In FIG. 4, CLK1 is seen to include a time period T1 during which no transitions occur. During T1, the determined frequency of CLK1 is less than Fmin. Upon detection of the frequency of CLK1 being less than Fmin, "low" or "0" pulses labeled "Inserted pulses" are inserted into CLK1 to generate CLK1'. It will be appreciated that the presence of the "Inserted pulses" in CLK1' increases the frequency of CLK1' to at least Fmin, thereby ensuring that CLK1' falls within the optimal range defined by Fmin and Fmax. In an exemplary embodiment, the minimum frequency limiting block 224 may include logic (not shown) to, e.g., insert "0" pulses when there is a static high level in CLK1, or insert "1" pulses when there is a static low level in CLK1.

In an exemplary embodiment, the frequency of CLK1 may be less than a minimum frequency Fmin, e.g., Fmin=1 MHz. In this case, the insertion block 310 may insert 1 MHz clock pulses into CLK1 to generate CLK1' having a minimum frequency no less than 1 MHz. In an exemplary embodiment, the inserted pulses may have a length of no more than a minimum duration, e.g., 400 ns.

Returning to FIG. 2, the control logic block 226 further includes a maximum frequency limiting block 228 for limiting the maximum frequency of the output voltages Non and Pon. In particular, block 228 may limit the frequency of CLK1' to be no more than the maximum frequency Fmax deemed optimal for supporting the boost converter output voltage Vboost_out. It will be appreciated that the maximum frequency limiting block 228 may generally implement any techniques known in the art for frequency reduction, i.e., as further described hereinbelow with reference to FIG. 5, or alternative techniques known in the art such as frequency division by counters, etc.

In certain exemplary embodiments, the maximum frequency limiting block 228 may dynamically adjust the value of the maximum frequency Fmax based on the target output voltage of the boost converter 120. In particular, Fmax may be related to the boost voltage Vbst=(Vboost_out−Vbatt) as follows (Equation 1):

$$Fmax=1/\Delta t=Vbst/T;$$

wherein $\Delta t$ is defined as the inverse of Fmax, and T is a proportionality constant chosen to accommodate the specific parameters of the boost design. In an exemplary embodiment, T may be chosen, e.g., to be proportional to the inductor value. In particular, in an exemplary embodiment, a predetermined value of inductor discharge current $\Delta I$ from L2 may over each cycle may be chosen by a designer. Accordingly, T may then be set as $T=\Delta I \cdot L2$, according to the general relationship $\Delta I=Vbst \cdot \Delta t/L2$. Note in alternative exemplary embodiments, other terms may be included in Equation 1, e.g., additional multiplicative or additive constants, etc., and such alternative exemplary embodiments are contemplated to be within the scope of the present disclosure.

Figure 5:
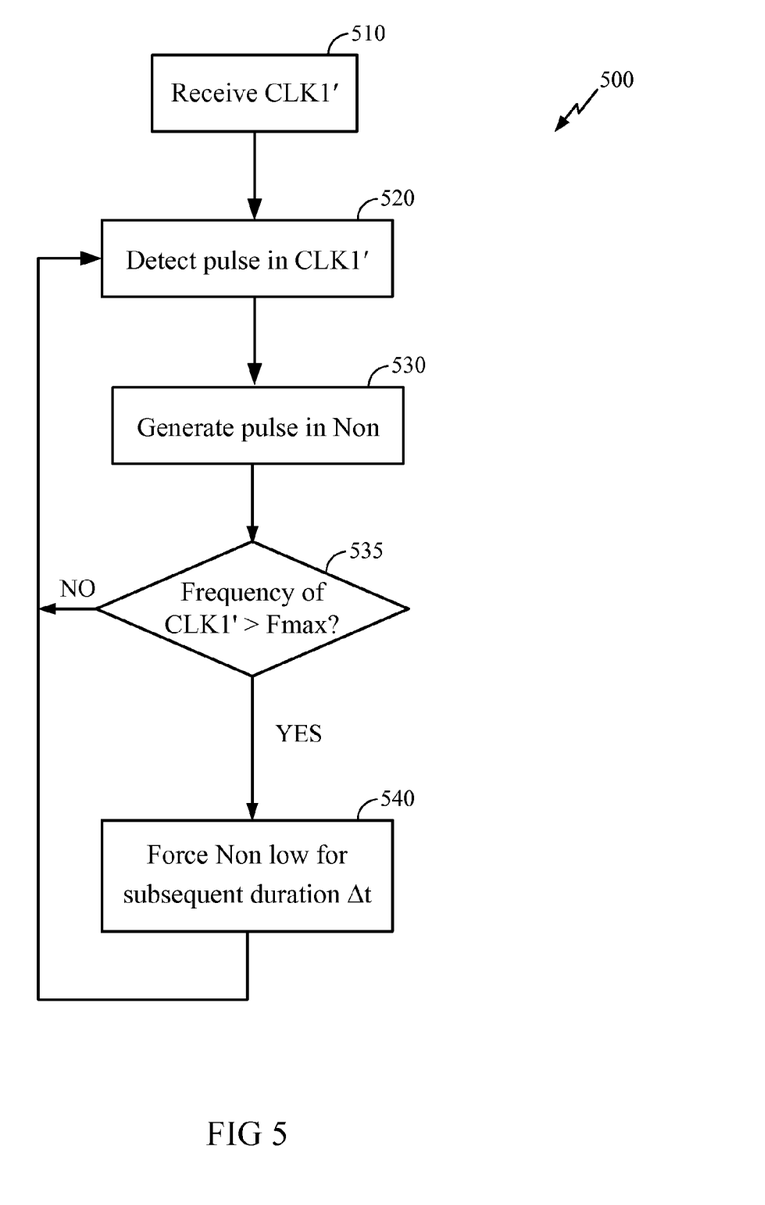
FIG. 5 illustrates an exemplary embodiment of a method that may be implemented by the control logic block of FIG. 2, which includes the maximum frequency limiting block.

FIG. 5 illustrates an exemplary embodiment of a method 500 that may be implemented by the control logic block 226 of FIG. 2, which includes the maximum frequency limiting block 228. Note the method 500 is shown for illustrative purposes only, and is not meant to limit the scope of the present disclosure to any particular implementation of maximum frequency limiting shown. For example, setting the frequency of a clock signal to be no more than a frequency Fmax (whether or not Fmax is set as according to Equation 1) may be achieved by one of ordinary skill in the art using other techniques not explicitly described herein. Such alternative exemplary embodiments are contemplated to be within the scope of the present disclosure.

In FIG. 5, at block 510, CLK1' is received, e.g., from the minimum frequency limiting block 510.

At block 520, a pulse is detected in CLK1'.

At block 530, responsive to detecting the pulse in CLK1', a pulse is generated in Non. In an exemplary embodiment, the width of the Non pulse may be controlled according to logical operations known in the art (not shown in the figures). For example, as previously described hereinabove, feedback mechanisms may be applied to control the difference between Vboost_out and a desired target output voltage by adjusting the pulse width of Non (and Pon).

At block 535, after the pulse is generated in Non, it is determined whether the frequency of CLK1' is greater than Fmax. If not, then the method may return to block 520 to await the next CLK1' pulse. If yes, then the method may proceed to block 540.

At block 540, Non may be forced low (i.e., the N2 may be forced to be off) for a time period $\Delta t$. In an exemplary embodiment, $\Delta t$ may be set as necessary to limit the maximum frequency of Non to no more than Fmax, which may be related to $\Delta t$ as $\Delta t=1/Fmax$. In an exemplary embodiment wherein Fmax is chosen according to Equation 1, $\Delta t$ may be set equal to T/Vbst. Note in this case, the inductor discharge current $\Delta I$ from L2 over each cycle may accordingly be computed as $\Delta I=Vbst \cdot \Delta t/L2=T/L2$.

Following block 540, after $\Delta t$ has elapsed, the method 500 returns to block 520 to wait for detection of the next pulse in CLK1'.

Note in alternative exemplary embodiments (not shown in FIG. 5), the determination of whether CLK1' frequency is greater than Fmax at block 535 may be performed at other times during the method processing. For example, the frequency determination may alternatively be performed between blocks 520 and 530. Such alternative exemplary embodiments are contemplated to be within the scope of the present disclosure.

Figure 6:
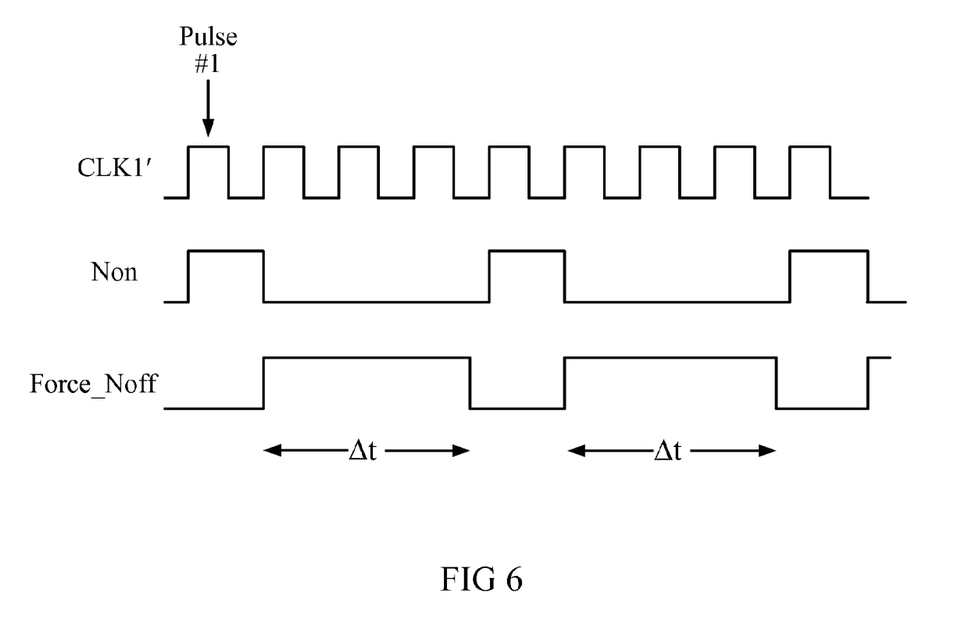
FIG. 6 illustrates exemplary signaling waveforms for CLK1' and Non generated according to the method of FIG. 5.

FIG. 6 illustrates exemplary signaling waveforms for CLK1' and Non generated according to the method 500. Note FIG. 6 is shown for illustrative purposes only, and is not meant to restrict the scope of the present disclosure to any particular signaling waveforms shown.

In FIG. 6, a CLK1' signal is provided. A signal Non is synchronized with the rising edge of CLK1'. Upon a first pulse (labeled Pulse #1 in FIG. 8) in CLK1' being detected, a corresponding pulse in Non is generated, e.g., as according to block 530 of method 500. As earlier noted hereinabove, the pulse duration of Non may depend on the boost converter control logic implemented to drive the boost converter output voltage to a desired target value. On the falling edge of Non, Force_Noff is asserted high. A timer is triggered for measuring a duration $\Delta t$, during which Force_Noff signal remains high. In an exemplary embodiment, Force_Noff is a signal that "blanks" or sets to 0 the output Non while Force_Noff is high.

In an exemplary embodiment, P2 may be turned on while N2 is forced off. Per the operation of block 540 of method 500, the boost converter switching may be enabled again only after $\Delta t$ expires. It will be appreciated that according to these operations, the maximum switching frequency of Non is effectively limited to Fmax<$1/\Delta t$.

Figure 7:
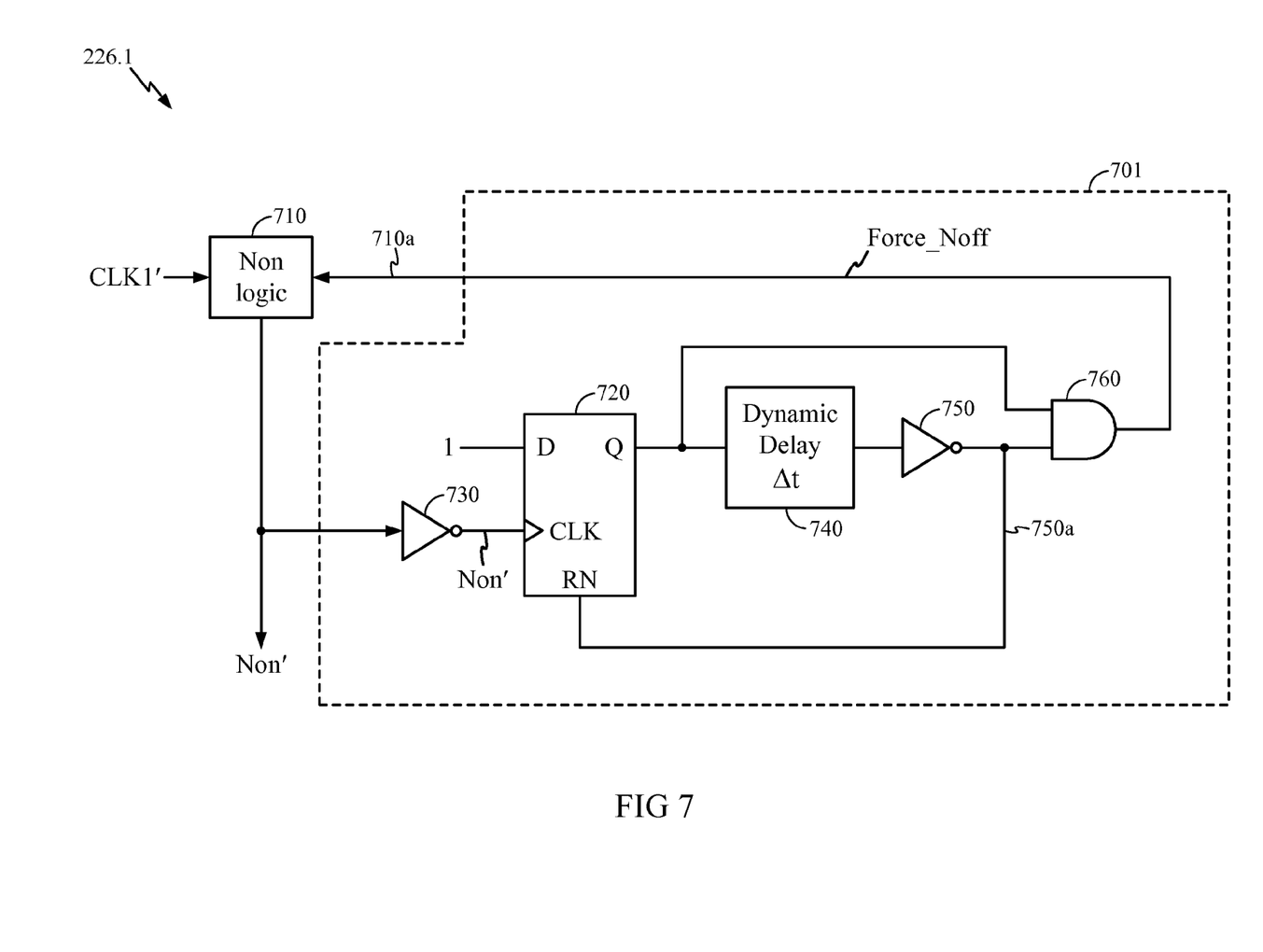
FIG. 7 illustrates an exemplary embodiment of the control logic block according to the present disclosure.

FIG. 7 illustrates an exemplary embodiment 226.1 of the control logic block 226 according to the present disclosure. Note the exemplary embodiment 226.1 is shown for illustrative purposes only, and is not meant to limit the scope of the present disclosure to any particular exemplary embodiment of the control logic block 226. It will be appreciated that while a logic block 710 is shown for generating Non in FIG. 7, a corresponding logic block (not shown) may readily be designed to generate Pon in light of the present disclosure, and provided in the control logic block 226. Such exemplary embodiments are contemplated to be within the scope of the present disclosure.

In FIG. 7, an Non logic block 710 is provided. In an exemplary embodiment, Non logic block 710 may modulate, e.g., the pulse width of Non to drive Vboost_out to a desired target voltage, according to principles known in the art. Block 710 accepts the input clock signal CLK1' and the Force_Noff signal 701a generated by the maximum frequency limiting block 701. Note the block 701 is shown for illustrative purposes only, and is not meant to limit the scope of the present disclosure to any particular exemplary embodiment of a maximum frequency limiting block shown.

Block 701 includes an inverter 730, whose output Non' is coupled to the CLK input of a D-Q flip-flop 720. As the D input of flip-flop 720 is set to 1, the Q output correspondingly transitions from 0 to 1 on the rising edge of Non'. The Q output of flip-flop 720 is coupled to a dynamic delay block 740, and also to an input of an AND gate 760. The dynamic delay block 740 introduces a delay of $\Delta t$ between its input and output, wherein $\Delta t$ may be chosen as described with reference to block 540 in FIG. 5. In particular, in an exemplary embodiment, $\Delta t$ may be chosen as T/Vbst to set Fmax according to Equation 1, as earlier described hereinabove. The output of block 740 is inverted by inverter 750, and further coupled to the other input of AND gate 760. Furthermore, the output of inverter 750 is also coupled to the inverse reset (RN) input of D-Q flip-flop 720, to reset the Q output of flip-flop to 0 when RN transitions low. The output of AND gate 760 corresponds to the Force_Noff signal, and is provided back to the Non logic block 710.

The operation of the control block 226.1 may be described as follows. When Non is 1, the Q output of flip-flop 720 is 0, and the output 750a of inverter 750 is correspondingly 1. Force_Noff is also 0. When Non transitions from 1 to 0, Q transitions from 0 to 1, and Force_Noff also transitions to 1. While Force_Noff is 1 (or high), Non is accordingly forced to 0 by the Non logic block 710.

After the delay $\Delta t$ introduced by the dynamic delay block 740, the output 750a of inverter 750 transitions to 0, which causes Force_Noff to transition from 1 to 0. Note Q is further reset to 0 by 750a transitioning to 0. As Force_Noff is 0, Non logic block 710 may pass through the next pulse in CLK1' to generate a new pulse in Non, per blocks 520 and 530 of method 500.

Per the principles of operation described hereinabove, Non logic block 710 may be understood to blank its output Non during the times when Force_Noff is high, thereby limiting the frequency of Non to reduce the switching frequency of the transistor switches N2, P2. In this manner, Fmax may be limited. In an exemplary embodiment wherein $\Delta t$ is chosen according to Equation 1, then Fmax may further be limited depending on the boost voltage Vbst.

Note while certain exemplary embodiments of the present disclosure may be described wherein Fmax is chosen according to Equation 1, it will be appreciated that the techniques described herein may generally be applied to implement maximum frequency limiting for any value of Fmax. For example, in alternative exemplary embodiments, the method 500 described hereinabove with reference to FIG. 5 may readily be modified to accommodate any value of Fmax, e.g., other than as specified by Equation 1. Such alternative exemplary embodiments are contemplated to be within the scope of the present disclosure.

Figure 8:
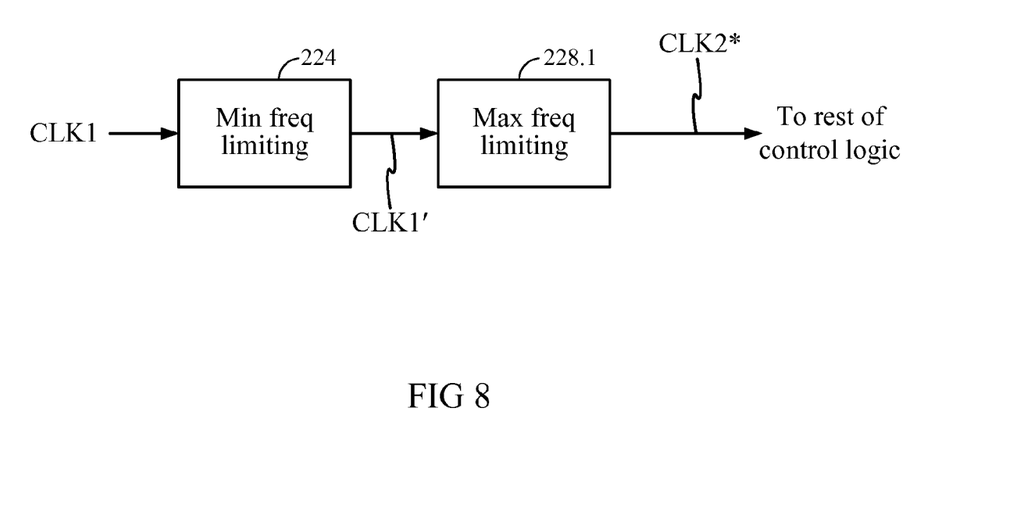
FIG. 8 illustrates an alternative exemplary embodiment of a scheme for limiting the minimum and maximum frequencies of a boost clock, wherein the frequency limiting blocks are coupled in series.

FIG. 8 illustrates an alternative exemplary embodiment of a scheme for limiting the minimum and maximum frequencies of a boost clock, wherein the frequency limiting blocks are coupled in series. In FIG. 8, the buck clock signal CLK1 is provided to a minimum frequency limiting block 224. In an exemplary embodiment, block 224 may be implemented as described hereinabove with reference to, e.g., FIGS. 3 and 4. The output of block 224, or CLK1', is provided to a maximum frequency limiting block 228.1. The block 228.1 may function to limit the maximum frequency of its input to no more than a certain pre-determined value Fmax. For example, in an exemplary embodiment, the block 228.1 may "swallow" clock pulses in CLK1' over a duration $\Delta t$, e.g., not pass through pulses in CLK1' to the output of block 228.1 over the duration of $\Delta t$, to generate an output signal CLK2* having a frequency less than Fmax. CLK2* is subsequently provided to the rest of control logic block 226, which may, e.g., modulate the pulse width of Non and Pon while switching the voltages at the frequency of CLK2*.

Note pulse swallowing is described herein for illustrative purposes only, and is not meant to limit the scope of the present disclosure to maximum frequency limiting techniques specifically employing pulse swallowing. In alternative exemplary embodiments, other techniques to limit the maximum frequency may be utilized, e.g., frequency division or other techniques known in the art. Such alternative exemplary embodiments are contemplated to be within the scope of the present disclosure.

Figure 9:
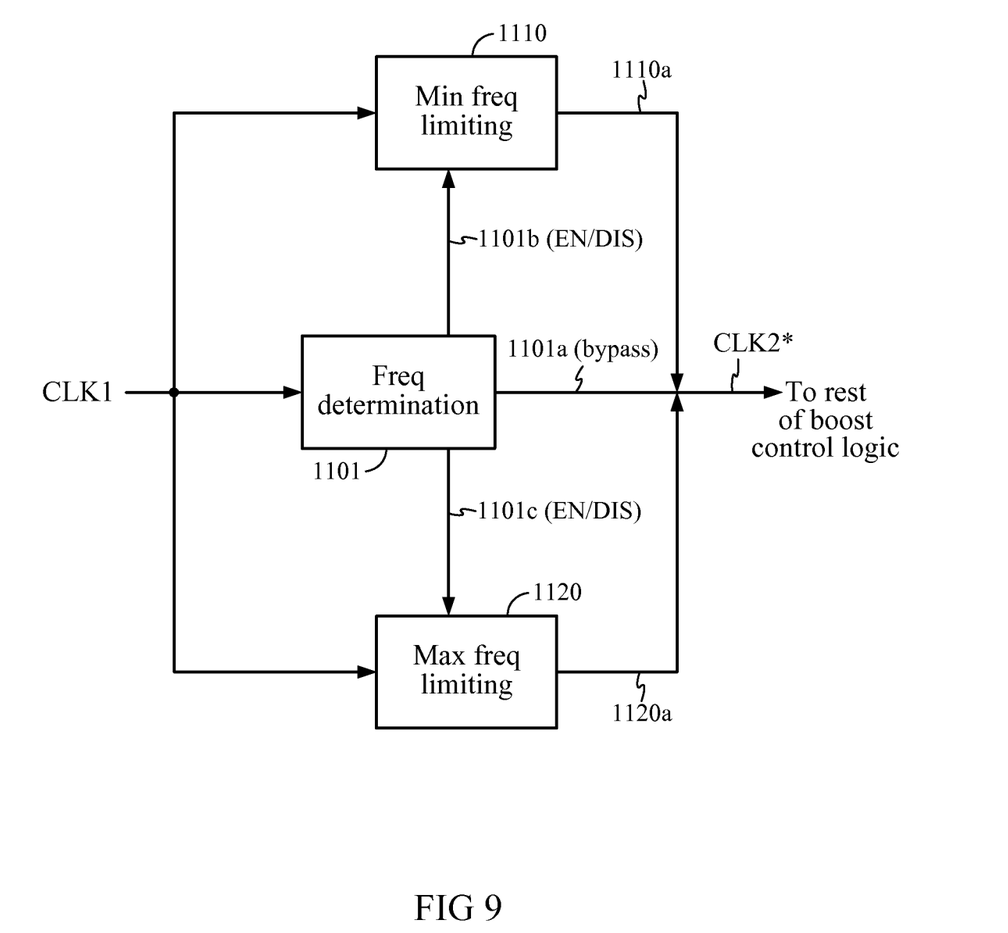
FIG. 9 illustrates an alternative exemplary embodiment of a scheme for limiting the minimum and maximum frequencies of a boost clock, wherein the frequency limiting blocks are coupled in parallel.

Note while blocks 224 and 228.1 are shown in FIG. 8 as being coupled to each other in series, in alternative exemplary embodiments, the blocks may instead be coupled in parallel. FIG. 9 illustrates an alternative exemplary embodiment of a scheme for limiting the minimum and maximum frequencies of a buck clock, wherein the frequency limiting blocks are coupled in parallel.

In FIG. 9, CLK1 is coupled to a frequency determination block 1101. Block 1101 may determine the frequency processing to be applied to CLK1 based on the frequency of CLK1. In particular, if the frequency of CLK1 is less than Fmin, then block 1101 may enable minimum frequency limiting block 1110 using signal 1101b to process CLK1 to limit its minimum frequency. If the frequency of CLK1 is greater than Fmax, then block 1101 may enable maximum frequency limiting block 1120 using signal 1101c to limit its maximum frequency. Otherwise, both blocks 1110 and 1120 may be disabled, and CLK1 may be directly provided to the output CLK2* in a bypass mode. It will be appreciated that alternative exemplary embodiments, e.g., incorporating parallel- or series-coupled frequency limiting/modulation elements known in the art, are contemplated to be within the scope of the present disclosure.

It will be appreciated that the exemplary embodiment 200 of FIG. 2 advantageously combines control logic and maximum frequency limiting, with the frequency limiting triggered by the Non falling edge, which is in turn determined by the pulse width control logic. On the other hand, the exemplary embodiments of FIGS. 8 and 9 purely perform a frequency limiting function, and thus will only provide generation of second switched converter clock edges (e.g., boost converter clock edges) synchronized to the rising edges of a first switched converter clock (e.g., buck converter clock). In this way, the clocks generated by FIGS. 8 and 9 will not be determinative of the necessary pulse width of the generated clock signals, e.g., the pulse width of Non. One of ordinary skill in the art will nevertheless appreciate that the techniques of FIGS. 8 and 9 may also be utilized to generate synchronized clocks for multiple switched converters of a system, and such alternative exemplary embodiments are contemplated to be within the scope of the present disclosure.

Figure 10:
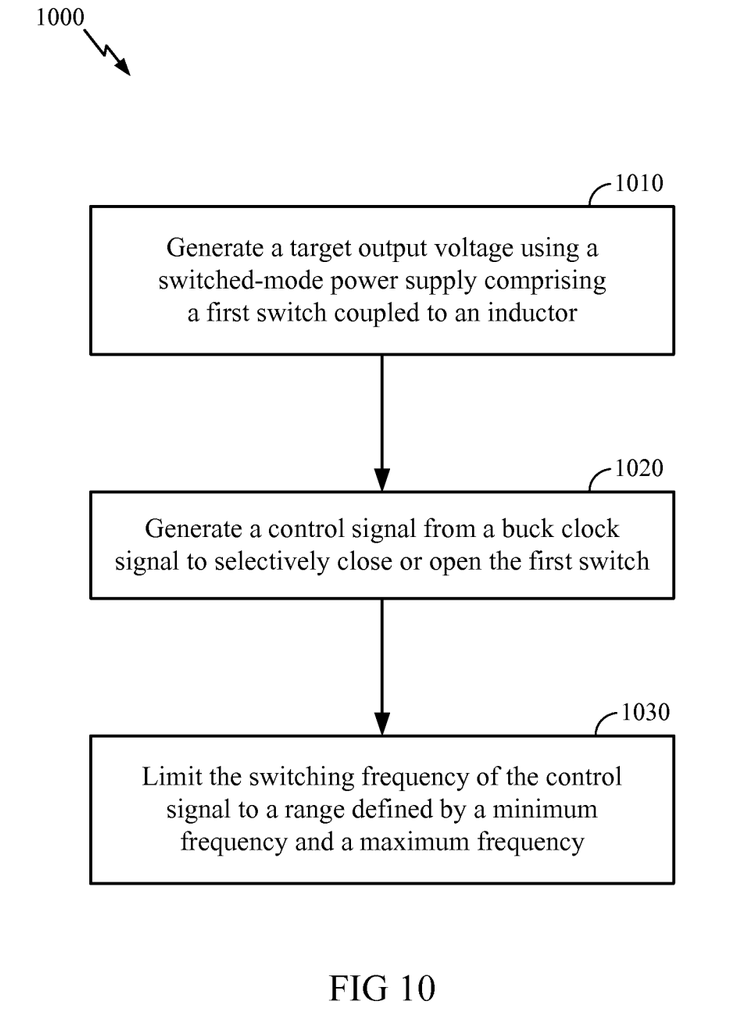
FIG. 10 illustrates an exemplary embodiment of a method according to the present disclosure.

FIG. 10 illustrates an exemplary embodiment of a method 1000 according to the present disclosure. Note the method 1000 is shown for illustrative purposes only, and is not meant to limit the scope of the present disclosure to any particular exemplary embodiment of a method 1000.

In FIG. 10, at block 1010, a target output voltage is generated using a switched-mode power supply comprising a first switch coupled to an inductor.

At block 1020, a control signal is generated from a buck clock signal to selectively close or open the first switch.

At block 1030, the switching frequency of the control signal is limited to a range defined by a minimum frequency and a maximum frequency.

Figure 11:
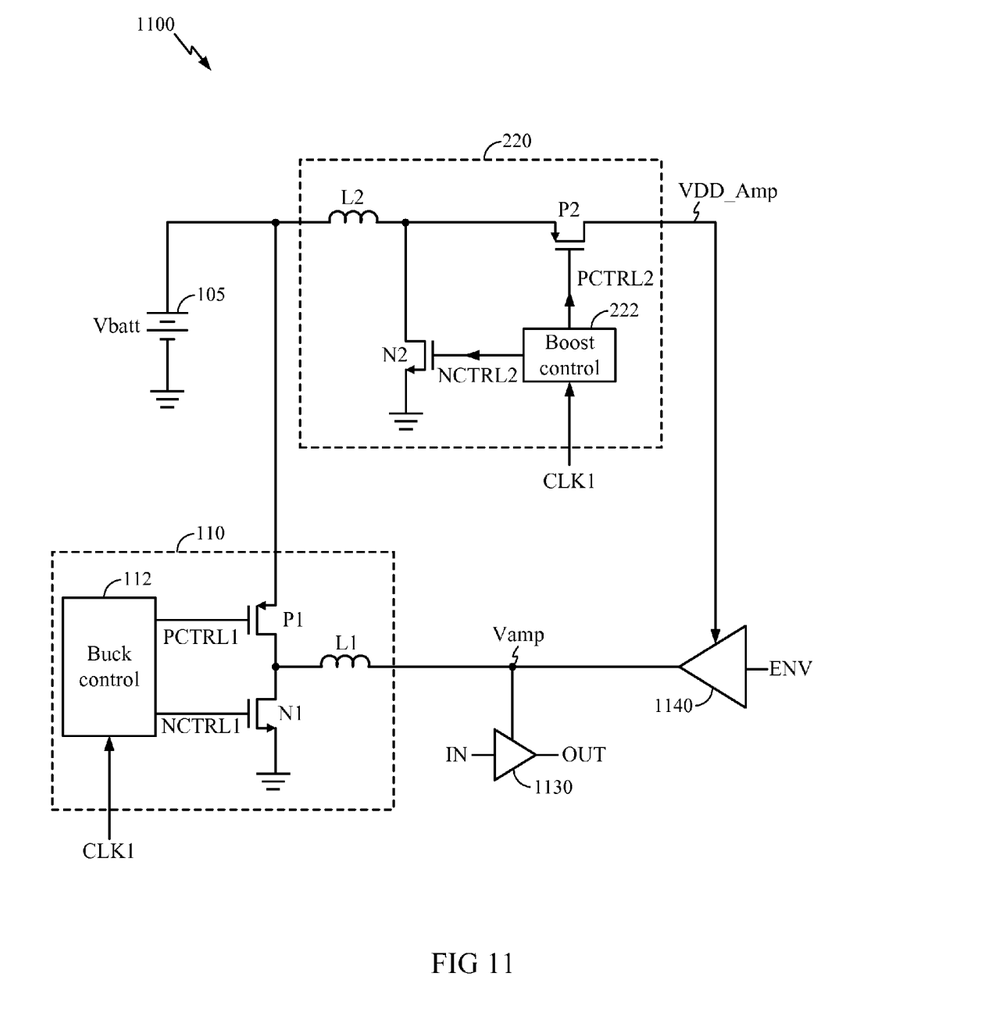
FIG. 11 illustrates an exemplary embodiment of the techniques of the present disclosure in an envelope tracking (ET) system.

FIG. 11 illustrates an exemplary embodiment of the techniques of the present disclosure in an envelope tracking (ET) system 1100. Note FIG. 11 is shown for illustrative purposes only, and is not meant to limit the scope of the present disclosure to only ET systems. For example, the techniques described herein may readily be applied to non-ET systems, e.g., wherein a buck converter is employed along with a boost converter to supply one or more arbitrary loads. Such alternative exemplary embodiments are contemplated to be within the scope of the present disclosure.

In FIG. 11, a power amplifier (PA) 1130 receives an input voltage IN and generates an amplified output voltage OUT. A voltage Vamp is provided to the PA 1130 as the PA supply voltage. Vamp is generated at least in part by an amplifier 1140, which may be a linear amplifier. The amplifier 1140 may amplify a voltage Env which tracks the envelope of the PA output voltage OUT, hence the denotation of the system 1100 as an "envelope tracking" system. Vamp may be maintained at a level sufficient to ensure linear operation of the PA 1130, i.e., to provide the PA output stage with sufficient "headroom," while nevertheless minimizing DC power consumption.

The amplifier 1140 is supplied by a voltage VDD_Amp generated by the boost converter 220. Note the boost converter 220 may incorporate a boost control block 222, whose details of operation are omitted from FIG. 11 for ease of illustration. The boost converter 220 may generate VDD_Amp at a "boosted" level, which may be higher than a supply voltage Vbatt of the boost converter 220 when necessary. In an implementation, Vbatt may be derived from the battery 105 of the ET system 1100. It will be appreciated that the level of VDD_Amp generated by the boost controller 120 will generally depend on the frequency and pulse durations of NCTRL2, PCTRL2, and thus the frequency of CLK2 should be appropriately chosen to ensure the desired operation of the boost controller 120.

Further shown in FIG. 11 is the buck converter 110 generating a buck output coupled to the supply voltage Vamp of PA 1130. In certain implementations, the buck converter 110 may step down Vbatt to a level Vamp lower than Vbatt. It will be appreciated that the buck converter 110 may supply, e.g., the low-frequency content of the power supply to the PA 130 when Vamp is lower than Vbatt, while the amplifier 1140 may supply higher-frequency content of the power supply to the PA 1130 arising from, e.g., fluctuations in the envelope of the PA output voltage.

Note while certain exemplary embodiments have been described hereinabove wherein a boost clock is generated from a buck clock, it will be appreciated that the techniques of the present disclosure may be generally applied to generate a clock signal for a switching converter synchronized with the clock signal for another switching converter in the same system. For example, in alternative exemplary embodiments (not shown), a boost clock may similarly be used to generate a buck clock for a buck converter, using techniques similar to those described hereinabove. Such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a buck converter configured to generate a first output voltage at a first output node; and
a boost converter comprising a switched-mode power supply configured to generate a second output voltage at a second output node, the power supply comprising:
a first switch coupled to an inductor, the first switch configurable to be selectively closed or opened; and
a control block configured to generate a control signal from a buck clock signal used in the buck converter to configure the first switch to be selectively closed or opened,
the control block comprising a first limiting circuit configured to set a frequency of the buck clock signal to a minimum frequency in response to the frequency being less than the minimum frequency, and a second limiting circuit configured to set the frequency of the buck clock signal to a maximum frequency in response to the frequency being greater than the maximum frequency, a frequency of the control signal being between the minimum frequency and maximum frequency.

2. The apparatus of claim 1, the first switch comprising an NMOS transistor, wherein selectively closing or opening the switch corresponds to coupling or decoupling the inductor to ground via the NMOS transistor.

3. The apparatus of claim 2, the power supply further comprising a second switch coupled to the inductor, the second switch comprising a PMOS transistor configured to selectively couple or decouple the inductor to the second output node.

4. The apparatus of claim 3, the control signal coupled to the NMOS transistor to turn the NMOS transistor on or off, the control block further configured to generate a second control signal derived from the control signal coupled to the PMOS transistor to turn the PMOS transistor on or off.

5. The apparatus of claim 4, the control block configured to turn the PMOS transistor on when the NMOS transistor is off, and to turn the PMOS transistor off when the NMOS transistor is on.

6. The apparatus of claim 2, the control block comprising a Force_Noff generation circuit configured to force the NMOS transistor off during a predetermined period of time.

7. The apparatus of claim 1, the maximum frequency configured to increase as the second output voltage is increased.

8. The apparatus of claim 7, the power supply coupled to a battery voltage, wherein a boost voltage is defined as the difference between the second output voltage of the boost converter and the battery voltage, and wherein the maximum frequency is directly proportional to the boost voltage.

9. The apparatus of claim 1, the control block comprising a pulse insertion block configured to insert pulses in the buck clock signal to generate the control signal.

10. An apparatus comprising:
a buck converter configured to generate a first output voltage at a first output node; and
a boost converter comprising a switched-mode power supply configured to generate a second output voltage at a second output node, the power supply comprising:
a switch coupled to an inductor, the switch configurable to be selectively closed or opened; and
a control block configured to generate a control signal from a buck clock signal provided to the buck converter to configure the switch to be selectively closed or opened, wherein the control block is configured to limit a switching frequency of the control signal to a range defined by a minimum frequency and a maximum frequency,
the switch comprising an NMOS transistor, wherein selectively closing or opening the switch corresponds to coupling or decoupling the inductor to ground via the NMOS transistor,
the control block comprising a Force_Noff generation circuit configured to force the NMOS transistor off during a predetermined period of time, the Force_Noff generation circuit comprising:
a logic block configured to accept the buck clock signal, the logic block generating an output corresponding to the control signal;
an inverting buffer coupled to the output of the logic block;
a D-Q flip-flop comprising a clock input coupled to the output of the inverting buffer, the D input of the flip-flop coupled to a 1 input;
a dynamic delay block coupled to the Q output of the flip-flop; and
an AND gate comprising a first input coupled to the Q output of the flip-flop and a second input coupled to an inverse of the output of the dynamic delay block, the output of the AND gate coupled to the logic block.

11. A method comprising:
generating a first output voltage using a buck converter;
generating a second output voltage using boost converter having a switched-mode power supply comprising a first switch coupled to an inductor;
generating a control signal from a buck clock signal generated to the buck converter to selectively close or open the first switch;
using a first limiting circuit to set a switching frequency of the buck clock signal to a minimum frequency when the switching frequency is less than the minimum frequency; and
using a second limiting circuit to set the switching frequency of the buck clock signal to a maximum frequency when the switching frequency is greater than the maximum frequency,
a frequency of the control signal being between the minimum frequency and maximum frequency.

12. The method of claim 11, further comprising:
increasing the maximum frequency in response to the second output voltage being increased.

13. The method of claim 12, wherein a boost voltage is defined as the difference between the second output voltage of the boost converter and a battery voltage coupled to the switched-mode power supply, and wherein the maximum frequency is directly proportional to the boost voltage.

14. The method of claim 11, further comprising inserting pulses in the buck clock signal to generate the control signal.

15. The method of claim 11, further comprising swallowing pulses in the buck clock signal to generate the control signal.

16. An apparatus comprising:
means for generated a first output voltage using a buck converter;
means for generating a second output voltage using boost converter having a switched-mode power supply comprising a first switch coupled to an inductor;
means for generating a control signal from a buck clock signal provided to the buck converter to selectively close or open the first switch;
means for setting a switching frequency of the buck clock signal to a minimum frequency when the switching frequency is less than the minimum frequency; and
means for setting the switching frequency of the buck clock signal to a maximum frequency when the switching frequency is greater than the maximum frequency,
a frequency of the control signal being between the minimum frequency and maximum frequency.

17. The apparatus of claim 16, further comprising:
means for increasing the maximum frequency in response to the second output voltage being increased.

18. The apparatus of claim 17, wherein a boost voltage is defined as the difference between the second output voltage of the boost converter and a battery voltage coupled to the switched-mode power supply, and wherein the maximum frequency is directly proportional to the boost voltage.

19. The apparatus of claim 16, further comprising inserting pulses in the buck clock signal to generate the control signal.

20. The apparatus of claim 16, further comprising swallowing pulses in the buck clock signal to generate the control signal.

* * * * *